(12) United States Patent
Bihler

(10) Patent No.: US 8,307,819 B2
(45) Date of Patent: Nov. 13, 2012

(54) SOLAR ELEMENT WITH TEMPERATURE CONTROL DEVICE

(76) Inventor: Willi Bihler, Biessenhofen-Altdorf (DE)

( * ) Notice: Subject to any disclaimer, the term of this patent is extended or adjusted under 35 U.S.C. 154(b) by 489 days.

(21) Appl. No.: 12/302,352

(22) PCT Filed: Jun. 8, 2007

(86) PCT No.: PCT/EP2007/005063
§ 371 (c)(1),
(2), (4) Date: Nov. 25, 2008

(87) PCT Pub. No.: WO2007/144113
PCT Pub. Date: Dec. 21, 2007

(65) Prior Publication Data
US 2009/0188489 A1 Jul. 30, 2009

(30) Foreign Application Priority Data
Jun. 13, 2006 (DE) .................. 10 2006 027 629

(51) Int. Cl.
*F24J 2/46* (2006.01)
*E04D 13/18* (2006.01)
*F28F 7/00* (2006.01)
*F28D 15/00* (2006.01)
*H01L 31/042* (2006.01)

(52) U.S. Cl. ........ 126/623; 126/621; 126/622; 126/711; 165/80.4; 165/104.33; 136/251

(58) Field of Classification Search .................. 126/711, 126/621–623; 29/890.033; 165/80.4, 184, 165/104.33; 136/251
See application file for complete search history.

(56) References Cited

U.S. PATENT DOCUMENTS

| | | | | |
|---|---|---|---|---|
| 4,112,918 A * | 9/1978 | Palkes | ........................ | 126/596 |
| 4,279,243 A * | 7/1981 | Deakin | ........................ | 126/709 |
| 4,586,227 A * | 5/1986 | Cornell | ........................ | 29/890.033 |
| 5,008,062 A | 4/1991 | Anderson et al. | | |
| 5,628,214 A * | 5/1997 | Evers | ........................ | 70/227 |
| 5,986,203 A * | 11/1999 | Hanoka et al. | ........................ | 136/251 |
| 6,052,961 A * | 4/2000 | Gibbs | ........................ | 52/518 |
| 6,080,927 A * | 6/2000 | Johnson | ........................ | 136/248 |
| 6,093,884 A * | 7/2000 | Toyomura et al. | ........................ | 136/244 |
| 6,591,557 B1 * | 7/2003 | Thomsen et al. | ........................ | 52/90.1 |
| 7,034,419 B2 * | 4/2006 | Kabasawa et al. | ........................ | 310/71 |
| 7,610,911 B2 * | 11/2009 | Neumann et al. | ........................ | 126/622 |
| 2006/0237000 A1 * | 10/2006 | Cheng | ........................ | 126/651 |

FOREIGN PATENT DOCUMENTS

| | | |
|---|---|---|
| DE | 30 38 671 | 5/1982 |
| DE | 31 12 468 | 10/1982 |
| DE | 35 13 910 | 10/1986 |
| DE | 38 31 631 | 3/1990 |
| DE | 44 24 801 | 1/1996 |
| DE | 196 51 226 | 6/1998 |
| DE | 298 10 238 | 10/1999 |

(Continued)

*Primary Examiner* — Kenneth Rinehart
*Assistant Examiner* — William Corboy
(74) *Attorney, Agent, or Firm* — Notaro, Michalos & Zaccaria P.C.

(57) ABSTRACT

The present invention relates to a solar element with solar cell carrier, frame and temperature control device, in which, in order to be simply producible, the temperature control device is an integral part of the frame. The invention relates furthermore to a method for the production of such solar element as well as the use of same.

7 Claims, 3 Drawing Sheets

FOREIGN PATENT DOCUMENTS

Figure 1:
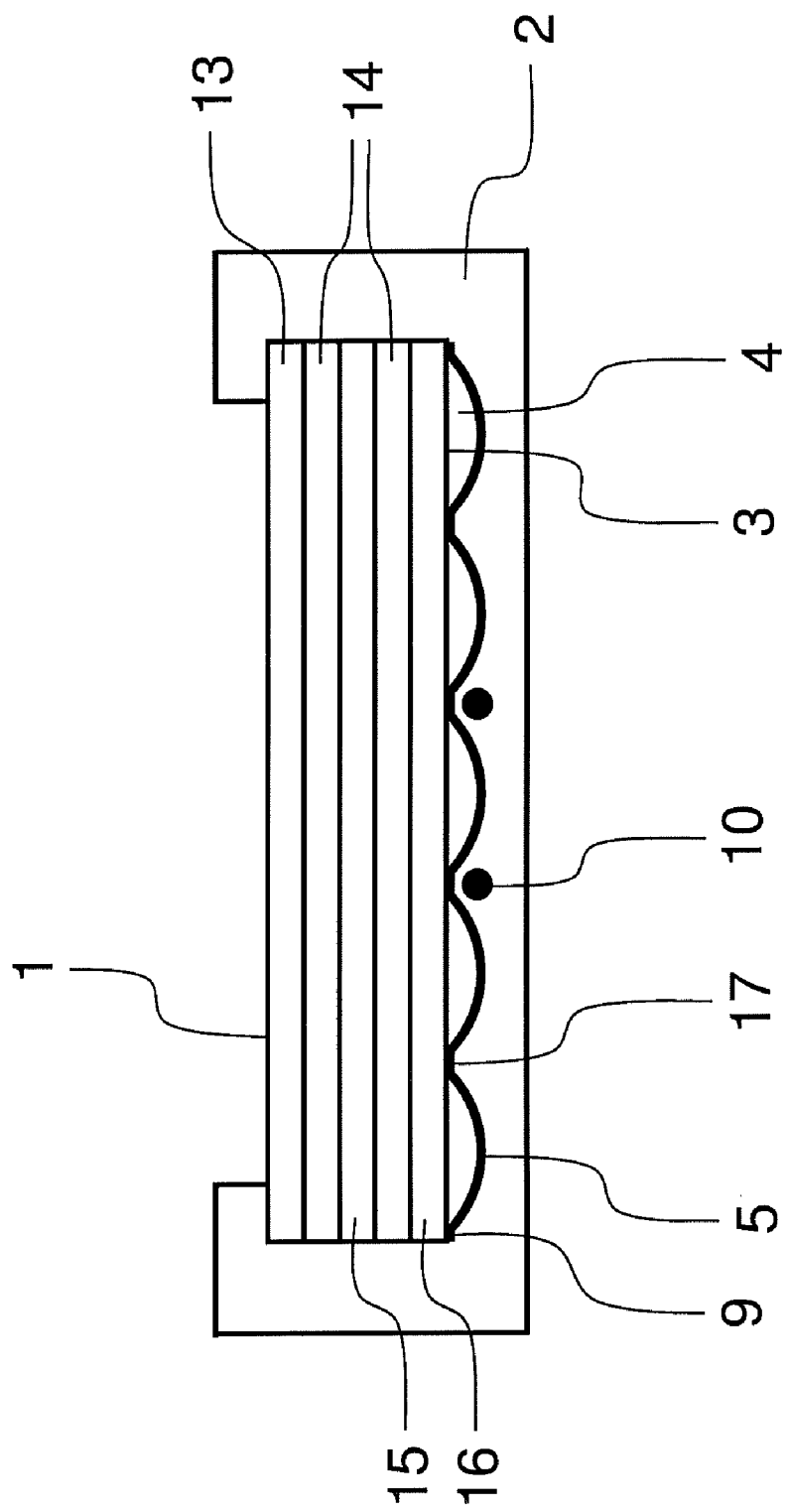

| | | |
|---|---|---|
| DE | 199 58 053 | 6/2001 |
| DE | 103 22 048 | 11/2003 |
| EP | 0 971 419 | 1/2000 |
| FR | 2506813 A1 * | 12/1982 |
| JP | 2000-114574 A * | 4/2000 |
| JP | 2000114574 | 4/2000 |
| JP | 2003318432 | 11/2003 |

* cited by examiner

SOLAR ELEMENT WITH TEMPERATURE CONTROL DEVICE

The present invention relates to a solar element comprised of solar cell carrier, frame and temperature control device, the frame being developed such that it covers at least one side of the solar element facing away from the sun, and wherein the temperature control device includes several interconnected hollow volumes, the hollow volumes being implemented as interconnected channels spaced apart from one another, which are formed such that they border on the solar cell carrier with their open side, as well as a method for the production of the solar element and its use.

Solar elements are conventionally comprised of a frame-set solar cell carrier, the latter, as a rule, being structured in layers. Facing the sunlight is a glass layer, as a rule single-pane safety glass, followed by a transparent synthetic material layer of ethylene vinyl acetate (EVA), in which are embedded the solar cells proper, for example photovoltaic cells. The mono- or polycrystalline solar cells are herein electrically interconnected by solder tape. Adjoining the EVA layer is a backing lamination of a weather resistant synthetic composite film, which, as a rule, is comprised of polyester and polyvinyl fluoride, for example a Tedlar film. Such solar cell carriers are fabricated with the optically active side facing down. Onto a glass is placed a cut-to-size EVA film, thereon are placed the solar cells which, by means of solder tape, are connected to individual strands and these are subsequently further electrically cabled. A further cut-to-size EVA film as well as the Tedlar film close off the layering. The lamination of the module prepared thus takes place at negative pressure and approximately 150° C., at which a polymerization reaction in the EVA film leads to a three-dimensionally cross-linked, clear synthetic material conjoined fixedly with the Tedlar film and the glass, which synthetic material encompasses the solar cells. In conclusion, the solar cell carrier is framed by means of an aluminum frame. This frame covers only the edges of the solar cell carrier and leaves its bottom and sun side to the greatest extent exposed. The solar element thus prepared is packaged, shipped and mounted, for example on a house roof together with further solar elements.

Such solar elements are subject to the risk of breakage, in particular in regions with high winter snow loads, which can be up to 700 kg/m$^2$. The solar elements mounted on house roofs are, as a rule, disposed on two mounting tracks connecting several solar elements with one another, wherein the latter tracks are fastened on the load bearing system of the roof by means of roof hooks encompassing roofing tiles. Due to this disposition, the solar elements easily sag under high snow load and can break. In the attempt to decrease the snow load of the solar elements mounted on the roof by sweeping off the snow, falls with fatal outcomes occur repeatedly.

Thereby that the aluminum frame leaves the side of the solar cell carrier facing away from the sun largely uncovered, its mechanical stability is not significantly increased, however, its back venting is advantageously made possible. This venting improves the highly temperature-dependent efficiency of the solar cells, since air can access the solar elements heated by the sun light and can dissipate heat. At high outside temperatures, however, the cooling effect of such back venting is correspondingly low and the solar cells under these conditions have operating temperatures of approximately 70° C. with an efficiency that is reduced by approximately 20% compared to the manufacturer's specification.

DE 103 22 048 A1 discloses an arrangement for gaining thermal and electrical energy from solar energy, the frame of which arrangement encompasses a solar cell carrier, wherein the frame includes channels for cooling means, which border on a solar module with their open side.

Of disadvantage in this invention is that it is laborious in production and is unable to tolerate major snow loads.

The invention therefore addresses the problem of specifying a solar element that at high mechanical stability and temperature control capability is simple in production and structure, a production method for the same as well as its use.

The subject problem is solved thereby that the channels are developed from at least one formed part, in particular synthetic formed part, and wherein the frame includes core reinforcements, preferably rod-shaped core reinforcements, which are disposed in a direction largely parallel to the channels between them and wherein solar cell carrier, frame and temperature control device are implemented unitarily and are nondetachably connected with one another. Thereby that the frame covers a side of the solar element which faces away from the sun, high mechanical stability is advantageously attained. The mechanical support formed in this way leads to the fact that incident loading, for example in the form of high snow loads, no longer leads to breakage of the solar elements since their surface is supported by the frame. If the temperature control device is an integral component of the frame, and if solar cell carrier, frame and temperature control device are implemented unitarily, then the result is simple mechanical handling of the solar element according to the invention. Providing a temperature control device as a nonseparable and integral component of the frame markedly simplifies structuring and production of the solar elements according to the invention. The frame protects the integrated temperature control device against environmental conditions or vandalism and permits the use of commercially available, finished laminated solar cell carriers without further modifications. If the channels are developed of at least one formed part, in particular a synthetic formed part, the advantage results of simple production and further processibility of the formed part, in particular as a synthetic formed part, also that of low weight, high wear resistance and long service life. The formed part with the channels can be fabricated of the same material as the frame or of another material. The channel structure can be produced simply and cost-effectively via deep-drawing a rectangular formed part, comprised for example of a synthetic material, with its size adapted to a desired solar cell carrier. If the frame includes core reinforcements, preferably rod-shaped steel core reinforcements, the core reinforcements being disposed in a largely parallel direction to the channels and between them, a mechanical reinforcement of a solar element according to the invention is advantageously realized. The disposition of the core reinforcements between the channels reinforces their wall without requiring additional space. Hereby material can be saved in the frame and the solar element according to the invention can be implemented with smaller dimensions.

An embodiment of the invention provides that the channels are largely implemented parallel and at the end sides are interconnected via a common inflow and a common outflow. This embodiment permits at great advantage an effective temperature control of the solar cells. Each of the channels extends according to the invention below a row of the solar cells disposed sequentially in the solar cell carrier. Since according to the invention the solar cell carrier borders directly on the channels, the heat transfer from the solar cells to the temperature control means is easy and efficient. Under snow load, the temperature control means can also be utilized for the purpose of heating the solar elements such that the snow located on the solar element melts off, or slides off the solar element on a molten layer of snow. In this way the dangerous wintertime sweeping of snow off the solar elements is no longer necessary. The common temperature control means inflow and outflow of the channels also contributes to an effective temperature control. The temperature control means flows from the inflow, which in the conventional inclined installation position of the solar elements is located at the bottom, simultaneously through all parallel channels of a solar element to the outflow, which in the inclined installation position is located above, such that a homogeneous temperature field can be attained which controls the temperature of all solar cells equally. In principle, a single meandering hollow volume is also conceivable. By spacing the channels apart from one another, the disposition of a core reinforcement between them is possible if such is statically required, without unnecessarily increasing the overall height of the solar element according to the invention.

Lastly, according to the invention it is also provided that the frame includes at least one lateral contact arrangement each, in particular a sealed contact arrangement, for an electric and a temperature control means connection to a further solar element, wherein the electric contact arrangement is implemented such that it establishes contact to all solar cells of a solar element. Several frames can in this way be simply connected with one another to form a larger system with a temperature control system continuous throughout, wherein the temperature control means is conducted through the entire solar element system. This makes advantageously superfluous the necessity of providing additional wiring between individual frames. Rather, it is possible to bundle all of the lines of the cells of a solar element at the electrical contact arrangement of a frame and to connect this frame at only this one site by means of the electric contact arrangement to a second frame. The frames according to the invention can in this way be connected to form a larger system simply and without using any tools. If the contact arrangements are sealed, loss of temperature control means is excluded as well as also a damaging environmental effect on the electric lines, for example through moisture.

If the frame is comprised of a synthetic material, preferably of a reinforced synthetic material, in particular of a fiber-reinforced or core reinforced synthetic material, especially particularly, of a polyurethane or an acrylonitrile butadiene styrene copolymer, the following advantages are realized: such a frame is lighter in weight than a metal frame while having the same mechanical stability. For application locations which are especially subject to the risk of snow loading, a fiber reinforcement or a core reinforcement is provided according to the invention such that loads of up to 500 kg/m² of solar element area can be tolerated. The synthetic frame can be produced using production methods which require lower costs than those of metal frames such that lower producing costs accrue. Such a frame can be produced, for example, using injection molding methods.

The method problem addressed by the invention is solved thereby that a production method comprises the steps:
  placing a formed part as well as optionally at least one core reinforcement into an injection mold,
  placing a solar cell carrier such that the solar cell carrier rests at least partially on the formed part, and
  injection molding a common frame around the formed part, the optionally at least one core reinforcement and the solar cell carrier.

Included in the invention is also an assembly set for a solar energy installation, comprised of at least two solar elements according to the above described characteristics, mounting tracks and roof hooks. Such an assembly set permits the fast, cost-effective mounting of an efficient solar energy system at great advantage.

Included in the invention is also the use of a solar element, such as described, for a solar energy installation.

Lastly, included in the invention is also a solar energy installation, which comprises, as explained, at least two, preferably, however, up to 15, solar elements.

The invention will be explained in the following in conjunction with the Figure of a drawing, wherein depict:
  FIG. 1 a section through a frame according to the invention,
  FIG. 2 an outline of three plugged-together solar elements in their installation position,
  FIG. 3a a sectioned view onto the interconnected channels, and
  FIG. 3b a perspective view of a detail of channel and inflow.

FIG. 1 shows a solar element according to the invention with a solar cell carrier 1, frame 2 and temperature control device 3 in cross section. The solar element is built up in layers comprised of a glass layer 13 facing the sun, an EVA (Ethylene Vinyl Acetate) layer 14, the solar cell layer 15 proper, a further EVA layer 14 as well as succeeding thereon a layer of a synthetic composite film of polyvinyl fluoride and polyester (Tedlar layer) 16. The frame 2 encompasses the edges of the solar cell carrier 1 which rests with its back side on a contact face 17 of the frame 2. The contact face 17 is herein developed by a deep-drawn plate 19 of ABS (acrylonitrile butadiene styrene copolymer). Into the surface of this plate are introduced semicylindrical channels 5 parallel to one another. These channels 5 are closed off by the solar cell carrier 1 such that in the solar element according to the invention ready to be installed, from the channels 5 hollow volumes 4 result which are connected with one another. This connection is established via tubular inflow 7, not depicted in FIG. 1, for temperature control means, here water, and a tubular outflow 8, also not depicted, for temperature control means. It is provided according to the invention that primarily water is utilized as the temperature control means. Hereby the invention also permits with advantage the generation of warm water since the water utilized for the temperature control is heated during its passage through the solar elements according to the invention. Thus, in the summertime relatively large quantities of water are available that are heated using environmentally friendly methods, which can also be used as service water. Water can be conveyed by means of a simple pump from the service supply pipes through the solar elements according to the invention without expensive and potentially environmentally damaging cooling means being required. In the frame 2 are provided contact arrangements 12 for the temperature control means, which are disposed laterally, thus orthogonally to the channels 5. These contact arrangements 12 are, for example, implemented in the manner of drain pipes, thus with conical regions which can be plugged one into the other. The inflow as well as also the outflow 7, 8 can be sealed. Solar elements according to the invention can readily and tightly be plugged one into the other and be connected to form a larger solar energy installation. The result is a solar element row whose first solar element is connected to a water pipe, a cistern or a well, and whose inflow 7 and outflow 8 are each connected with the next solar element in the row. The nonrequired openings of the contact arrangements of the first and last solar element are reversibly and tightly closed with covers. In the installation position of the solar elements on a roof, inflows 7 are located at the bottom such that inflowing water fills first the inflows 7 of all solar elements of the row, subsequently flows through the parallel channels 5 to an equal extent upwardly to the outflows 8, disposed at the top in the installation position, and from here via the last solar element in the solar element row exits having been heated in the summer and cooled in the winter and is fed, for example, into a service water system. Inflow 7 and outflow 8 are herein so dimensioned that their interior volume corresponds approximately to that of the sum of all channels 5. At a specific point in time, therefore, approximately the same amount of water is in the inflow 7 as is in the channels 5 of a solar element or a solar element row. The water flowing in the channels 5 is in contact with the solar cell carrier 1, since the latter forms a wall of the channels 5. Between the channels 5, which are here developed semicylindrically, however can also assume any other suitable shape, plate 19 furthermore includes support or contact webs 18 on which rests the solar element carrier 1. These support webs 18 have a width of approximately 5 mm. If required, between two channels 5 is provided a core reinforcement 10 in the form of steel rods which increase the mechanical stability of the solar element according to the invention and that of the channel walls.

Apart from the contact arrangements for temperature control means 12, a contact arrangement 11 for electrical lines is provided. According to the invention, in this contact arrangement all lines of the discrete solar cells of the solar element are joined together. This contact arrangement is implemented as a male/female plug, or in any other manner known to the person of skill in the art, adjacent to the contact arrangements for temperature control means 12 or is integrated into these. These contact arrangements 11, 12 permit the quick and secure connection of several solar elements according to the invention with the least number of tools. The solar installation size thus obtained can be adapted to any desired requirement.

After the fabrication, the solar element according to the invention is implemented as one piece. Solar cell carrier 1 and temperature control device 3 are nondetachably connected with one another through an injected-molded frame 2 of synthetic material. The synthetic material to consider herein is in particular ABS whose mechanical properties correspond especially closely to the requirements. However, any other synthetic material is also utilizable, which has the requisite mechanical properties. For the production of the solar element according to the invention, first, a plate 19 bearing the channels 5 is produced in suitable manner in the desired form and size, for example by deep-drawing of a synthetic material. For the production of the solar element, if required, a core reinforcement 10 is placed into an injection mold, followed by plate 19 as well as a solar cell carrier 1, laminated or not laminated and combined of known structural parts. In the next step the mold is closed and the desired synthetic material is injected, wherein around the edges of the solar cell carrier 1, the core reinforcement 10 and the plate 19 the synthetic material is injected to a certain material thickness, such as is depicted in FIG. 1. If statically possible, not the entire plate 19 is encompassed by injection-molded synthetic material, but only the region between two channels with the core reinforcement 10 emplaced here and the lateral region encompassing the solar cell carrier 1. In this case a portion of the plate 19 of a finished solar element would be visible.

Figure 2:
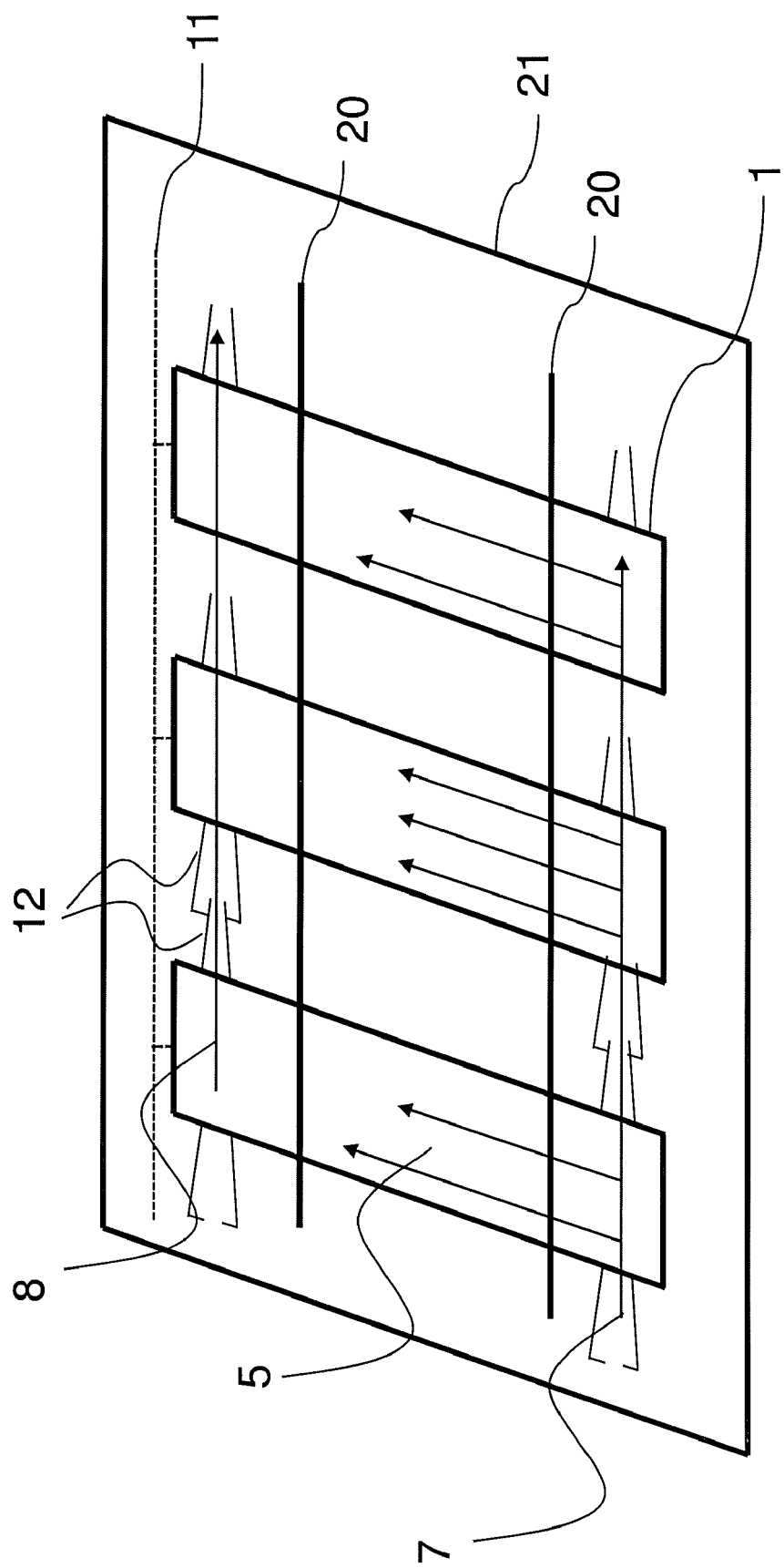

FIG. 2 depicts a partially sectioned drawing of three solar elements according to the invention secured via mounting tracks 20 in their installation position on a roof 21. Outlined are the temperature control means connections 12 as well as the temperature control means flow in the channels 5. The inflow of the water for all three solar elements takes place in the lower region. Due to the pressure obtaining in the building water pipe or generated by a pump, the water rises in the channels 5 upwardly toward a continuous outflow channel 8 common to all channels and from here into a, not shown, outflow or service water tank. The homogeneous temperature field generated thusly below the solar cells improves their efficiency. The electrical connections are not shown. They are located directly adjacent to the temperature control means connections 12, in order to implement the constructional expenditures and the plugging-in of the connections as simple as possible when setting up a solar element row.

Figures 3A, 3B:
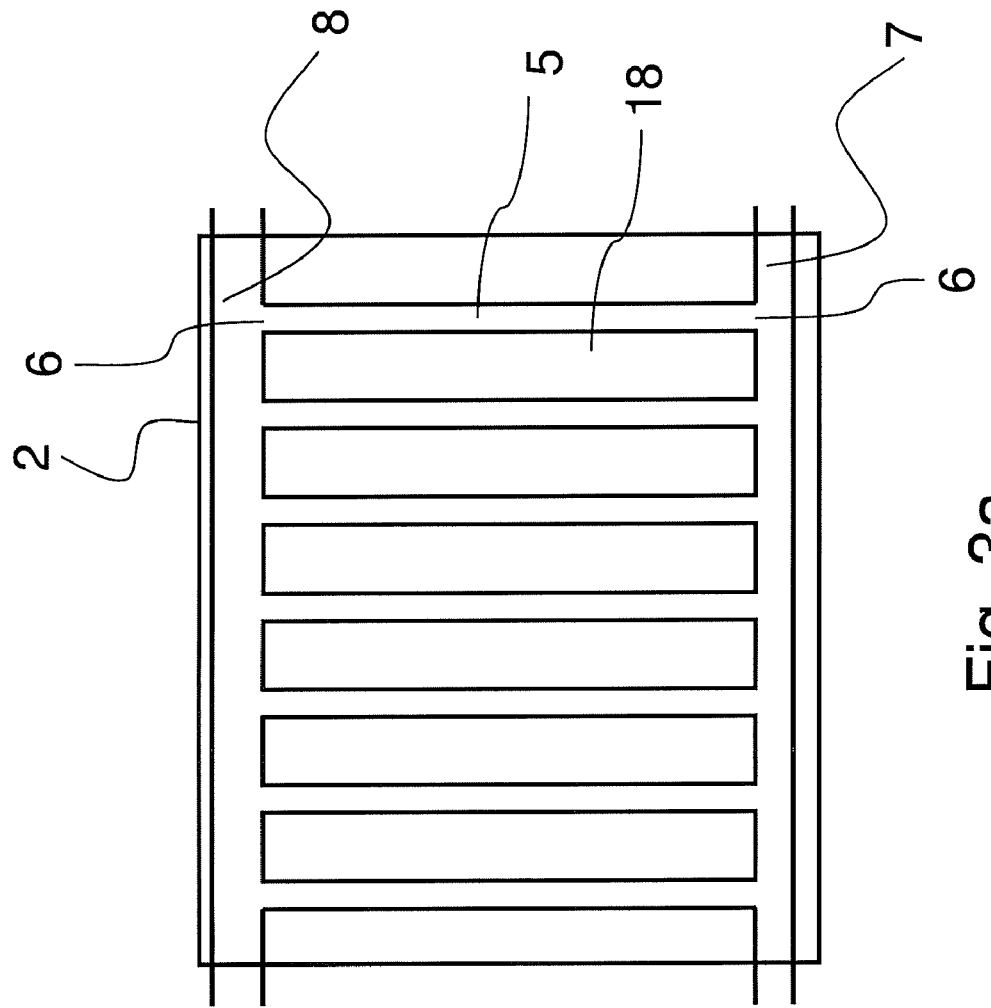

FIG. 3a depicts an outline of a top view onto the channel system 5 of a solar element with inflow and outflow 7, 8 without temperature control means connections 12. The top view is in the plane directly beneath the solar cell carrier 1. Between the semicylindrical channels 5 are located support webs 18 and, optionally, core reinforcements 10 disposed beneath them. Inflow 7 and outflow 8 can be connected to adjacent solar elements.

FIG. 3b depicts a detail from the connection of inflow 7 and channel 5. The inflow 7 is developed as a tube open laterally at intervals, wherein the channels 5 are developed in a plate 19 as approximately halved tubes, whose longitudinal opening is directed upwardly toward a, not shown, solar cell carrier 1. The volume of the tubes 7, 8 corresponds approximately to the sum of all channels 5 of a plate 19.

LIST OF REFERENCE NUMBERS

1 Solar cell carrier
2 Frame
3 Temperature control device
4 Hollow volume
5 Channel
6 End side
7 Inflow
8 Outflow
9 Formed part
10 Core reinforcement
11 Electrical connection
12 Temperature control means connection
13 Glass layer
14 EVA layer
15 Tedlar layer
16 Solar cells
17 Contact face
18 Support webs
19 Plate
20 Mounting tracks
21 Roof

The invention claimed is:

1. A solar element comprising:
a solar cell carrier (1) comprising a plurality of parallel protective and support layers (13, 14, 16) and a solar cell layer (15) containing a plurality of photovoltaic solar cells, a first plurality of the protective and support layers (13, 14) being parallel to and over the solar cell layer (15) and a second plurality of the protective and support layers (14, 16) being parallel to and under the solar cell layer (15);
a frame (2) around the solar cell carrier (1) for supporting the solar cell carrier (1); and
a temperature control device (3) supported by the frame (2), under the second plurality of the protective and support layers (14, 16);
the frame (2) covering one side facing away from the sun of the solar cell carrier (1) and wherein the temperature control device (3) is an integral component of the frame (2), the temperature control device (3) comprising a deep-drawn plate (9, 19) of acrylonitrile butadiene styrene (ABS) copolymer having a plurality of spaced apart contact faces (17) contacting an under surface of the second plurality of the protective and support layers (14, 16), the deep-drawn plate (9, 19) having a plurality of interconnected hollow volumes (4) between the contact faces (17), the hollow volumes (4) comprising interconnected canals (5) spaced apart from one another, and the canals formed such that they border with their open side on the solar cell carrier (1);

wherein the canals (5) are substantially parallel and are formed such that they are connected at their end sides (6) via an inflow (7) and an outflow (8) and that the canals (5) are formed by the deep-drawn plate (9, 19) and wherein the frame (2) includes rod-shaped steel core reinforcements (10) which are disposed in a substantially parallel direction to the canals (5), between the canals (5) and under each respective contact face (17);

wherein the solar cell carrier (1), the frame (2) and the temperature control device (3) are implemented unitarily and non-detachably connected after fabrication of the solar element; and wherein said frame (2) is produced by injection molding.

2. A solar element as claimed in claim 1, wherein the frame (2) comprises at least one sealed, lateral contact arrangement for an electrical connection (11) to a further solar element and at least one, sealed, lateral contact arrangement for a temperature control means connection (12) to a further solar element, wherein the electrical contact arrangement (11) is formed such that it establishes contact to all solar cells of a solar element.

3. A solar element as claimed in claim 1, wherein the frame (2) is a substance selected from the group consisting of fiber-reinforced polyurethane of the type that can be injection molded, core reinforced polyurethane of the type that can be injection molded, a fiber-reinforced acrylonitrile butadiene styrene copolymer and core reinforced acrylonitrile butadiene styrene copolymer.

4. Use of a solar element as claimed in claim 1 for a solar energy installation by merging at least two solar elements to a solar element aggregation.

5. Solar energy installation comprising at least two solar elements as claimed in claim 1.

6. A solar element as claimed in claim 1, wherein the first plurality of the protective and support layers comprises an outer glass layer (13) and an inner layer of ethylene vinyl acetate (14) and a second plurality of the protective and support layers comprises an outer layer of ethylene vinyl acetate (14) and an inner layer of polyvinyl fluoride and polyester (16).

7. A method for the production of a solar element as claimed in claim 1, comprising the steps of:
 a) placing a formed part (9) as well as at least one core reinforcement (10) into an injection mold;
 b) placing a solar cell carrier (1), such that the solar cell carrier (1) rests at least partially on the formed part (9); and
 c) injection molding a common frame (2) around the formed part (9), the at least one core reinforcement (10) and the solar cell carrier (1);

the solar cell carrier (1) comprising a plurality of parallel protective and support layers (13, 14, 16) and a solar cell layer (15) containing a plurality of photovoltaic solar cells, a first plurality of the protective and support layers (13, 14) being parallel to and over the solar cell layer (15) and a second plurality of the protective and support layers (14, 16) being parallel to and under the solar cell layer (15); and the formed part (9) comprising a deep-drawn plate (19) of acrylonitrile butadiene styrene (ABS) copolymer having a plurality of spaced apart contact faces (17) contacting an under surface of the second plurality of the protective and support layers (14, 16), the deep-drawn plate (9, 19) having a plurality of interconnected hollow volumes (4) between the contact faces (17), the hollow volumes (4) comprising interconnected canals (5) spaced apart from one another, and the canals formed such that they border with their open side on the solar cell carrier (1).

* * * * *